(12) United States Patent
Colgan et al.

(10) Patent No.: US 8,693,200 B2
(45) Date of Patent: Apr. 8, 2014

(54) SEMICONDUCTOR DEVICE COOLING MODULE

(75) Inventors: Evan G. Colgan, Chestnut Ridge, NY (US); Michael A. Gaynes, Vestal, NY (US); Jeffrey A. Zitz, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 229 days.

(21) Appl. No.: 13/368,031

(22) Filed: Feb. 7, 2012

(65) Prior Publication Data

US 2013/0199752 A1  Aug. 8, 2013

(51) Int. Cl.
*H05K 7/20* (2006.01)

(52) U.S. Cl.
USPC ............ 361/702; 361/679.52; 361/679.54; 361/699; 361/719; 439/487

(58) Field of Classification Search
USPC ............ 361/679.52, 679.54, 699, 702, 714; 165/185; 439/485, 487
See application file for complete search history.

(56) References Cited

U.S. PATENT DOCUMENTS

| | | | |
|---|---|---|---|
| 5,548,482 A | | 8/1996 | Hatauchi et al. |
| 5,770,891 A * | | 6/1998 | Frankeny et al. ............ 257/727 |
| 5,784,257 A | | 7/1998 | Tata |
| 5,932,925 A * | | 8/1999 | McIntyre ...................... 257/719 |
| 5,946,189 A | | 8/1999 | Koenen et al. |
| 6,058,014 A * | | 5/2000 | Choudhury et al. .......... 361/704 |
| 6,198,630 B1 * | | 3/2001 | Cromwell ..................... 361/704 |
| 6,349,034 B2 | | 2/2002 | Allen |
| 6,349,035 B1 | | 2/2002 | Koenen |
| 6,600,652 B2 * | | 7/2003 | Chandran et al. ............. 361/704 |
| 6,724,629 B1 * | | 4/2004 | Augustin et al. .............. 361/704 |
| 6,734,371 B2 | | 5/2004 | Arrigotti et al. |
| 6,771,506 B2 | | 8/2004 | Lee et al. |
| 6,802,733 B2 * | | 10/2004 | Colbert et al. ................ 439/331 |
| 6,877,993 B2 * | | 4/2005 | Palaniappa et al. ............. 439/73 |
| 6,930,884 B2 * | | 8/2005 | Cromwell et al. ............ 361/710 |
| 6,970,354 B2 * | | 11/2005 | Villanueva et al. ...... 361/679.54 |
| 7,044,196 B2 | | 5/2006 | Shook et al. |
| 7,236,369 B2 | | 6/2007 | Barina et al. |
| 7,280,362 B2 * | | 10/2007 | Hood et al. ................... 361/719 |
| 7,323,358 B1 * | | 1/2008 | Cromwell ..................... 438/106 |

(Continued)

FOREIGN PATENT DOCUMENTS

DE         20304194 U1    6/2003
JP      2006287149 A  *  10/2006  ............. H01L 23/40

OTHER PUBLICATIONS

Socket Assembly for Pinless Array Integrated Circuit Package, IBM Technical Disclosure Bulletin, vol. 24, No. 12, May 1982.*

*Primary Examiner* — Robert J Hoffberg
(74) *Attorney, Agent, or Firm* — Cantor Colburn LLP; Vazken Alexanian

(57) ABSTRACT

A cooling module for cooling a semiconductor is provided and includes a land grid array (LGA) interposer, a substrate with an LGA side and a chip side, a cooler, a load frame attached to the substrate and formed to define an aperture in which the cooler is removably disposable, a spring clamp removably attachable to the load frame and configured to apply force from the load frame to the cooler such that the substrate and the cooler are urged together about the semiconductor and a load assembly device configured to urge the load frame and the LGA interposer together.

17 Claims, 10 Drawing Sheets

(56) References Cited

U.S. PATENT DOCUMENTS

| | | |
|---|---|---|
| 7,375,963 B2 * | 5/2008 | Eckberg et al. .............. 361/704 |
| 7,388,751 B2 * | 6/2008 | Hood et al. .................. 361/704 |
| 7,486,516 B2 * | 2/2009 | Colbert et al. ............... 361/710 |
| 7,499,279 B2 * | 3/2009 | Campbell et al. ............ 361/702 |
| 7,536,781 B2 * | 5/2009 | Cromwell ...................... 29/832 |
| 7,558,066 B2 * | 7/2009 | Eckberg et al. .............. 361/704 |
| 7,606,033 B2 * | 10/2009 | Colbert et al. ............... 361/710 |
| 7,697,299 B2 | 4/2010 | Desrosiers et al. |
| 7,719,839 B2 | 5/2010 | Hoss et al. |
| 7,751,918 B2 * | 7/2010 | Campbell et al. .............. 700/97 |
| 7,777,329 B2 * | 8/2010 | Colbert et al. ............... 257/719 |
| 7,903,411 B2 * | 3/2011 | Campbell et al. ............ 361/704 |
| 2004/0247925 A1 * | 12/2004 | Cromwell ..................... 428/548 |
| 2005/0256241 A1 | 11/2005 | Sachdev et al. |
| 2007/0263363 A1 | 11/2007 | Liu et al. |

* cited by examiner

SEMICONDUCTOR DEVICE COOLING MODULE

BACKGROUND

Aspects of the present invention relate to a semiconductor device cooling module and, more particularly, to a separable and replaceable cooling module for cooling one or more semiconductor devices.

In the packaging of semiconductor chips, an organic substrate is typically used to fan out fine pitch (e.g., 0.15 to 0.2 millimeter (mm)) controlled collapse chip connection (C4) solder bumps on the silicon die to larger pitch (e.g., 1.0 to 1.2 mm) ball grid array (BGA) or land grid array (LGA) connections. With a BGA, the chip package is attached to a printed circuit board by reflowing solder balls to form a permanent connection whereas an LGA type interposer provides a connection where the chip package can be readily removed and replaced on the printed circuit board (PCB). An LGA interposer may be a "hybrid-type" where the bottom of the interposer is connected to the PCB by BGA solder balls, but the upper connection to the substrate is through an LGA type connection. No distinctions will be made between an LGA and hybrid LGA interposers.

In general, with an organic packaging substrate, a lid formed from a thermally conductive material such as copper is attached to the chip and the organic substrate to protect the chip during handling and add mechanical strength to the organic substrate. A thermal interface material (TIM) material is dispensed between the back surface of the chip and the lid to provide a thermal path for heat dissipation. If required, a heat sink is then attached using a second TIM layer to the outside surface of the lid, although the need for first and second TIM layers can be an unacceptable limitation in some cases.

The chip is mounted face or device side down on the packaging substrate. When used with an LGA interposer, a compressive load is applied to the package lid to make electrical contact between the LGA and the PCB. This compressive load may be applied either in a center position above the chip or at two or more points on a perimeter of the package lid.

For high performance computing, there has recently been significant development on various chip stack structures as further improvements to device performance that are obtained by scaling down device dimensions is becoming increasingly difficult to achieve. For example, in some chip stacks, the chips are already thinned down to enable the fabrication of fine pitch thru silicon vias (TSV), which can reduce the mechanical strength of the chips. Therefore, it may be desirable to avoid actuating the load for an LGA through the chip stack, especially as the size of the substrate and hence the required load increases.

For applications with a high power density or which require a low junction operating temperature, a packaging solution where the heat sink can be directly attached to the back surface of the chip or chip stack may be required. The use of only a single TIM layer between the chip or chip stack and the heat sink results in improved thermal performance compared to a lidded chip package where two TIM layers are required. This is typically referred to as a lidless or direct heat sink attach package. For high performance systems, it is generally desirable to use LGA chip packages instead of BGA chip packages so that the chip can be replaced if necessary. As the chip complexity increases and the power and input/output (I/O) requirements grow, the size of the package generally increases to provide a greater number of LGA contacts.

For a lidless package where the LGA actuation load is provided through the chip, the substrate or the combination of the substrate and top surface stiffener, there may be a need to provide enough mechanical rigidity to distribute a load with sufficient uniformity across the LGA interposer to facilitate formation of electrical contacts for all the connection pads. For organic substrates, this may limit an allowable substrate size and for ceramic substrates this may increase the required thickness. When the LGA actuation load is provided to the substrate, a load frame (or stiffener) with an opening for the chip may be attached to the substrate, and the combined structure needs to provide adequate mechanical stiffness to actuate the LGA uniformly.

A further trend in high performance chip cooling is the use of direct water cooling where a water cooling device is attached to the chip with a TIM layer. This can enable a lower junction temperature for improved reliability, allow for higher power density chips and improve overall system energy efficiency. Generally, with field replaceable water cooled modules, either a TIM layer or water connections need to be broken or reworked to replace a module. To avoid any risk of spilling water or subsequent leaks, reworking the TIM layer is the preferred approach. As noted above, LGA interposers are used for field replaceable modules.

SUMMARY

According to an aspect of the present invention, a cooling module for cooling a semiconductor is provided and includes a land grid array (LGA) interposer, a substrate with an LGA side and a chip side, a cooler, a load frame attached to the substrate and formed to define an aperture in which the cooler is removably disposable, a spring clamp removably attachable to the load frame and configured to apply force from the load frame to the cooler such that the substrate and the cooler are urged together about the semiconductor and a load assembly device configured to urge the load frame and the LGA interposer together.

According to another aspect, a cooling module for cooling one or more semiconductor devices is provided and includes a land grid array (LGA) interposer, a substrate with an LGA side and a chip side to which a semiconductor device is attachable, a cooler including a fluid chamber having a chip side and a clamp side and fluid inlet and outlet openings, a load frame attached to the substrate and formed to define an aperture in which the cooler is removably disposable, a spring clamp removably attachable to the load frame and configured to apply force from the load frame to the clamp side of the cooler such that the respective chip sides of the substrate and the cooler are urged toward one another and a removable load assembly device that is configured to apply a connection force between the load frame and the LGA interposer to urge the load frame and the LGA interposer together.

According to another aspect, a separable and replaceable cooling module for cooling one or more semiconductor devices is provided. The module includes a land grid array (LGA) interposer with one or more LGA electrical contacts on a board side thereof that are each connectable to one or more LGA substrate side contacts, a substrate with an LGA side and a chip side, the LGA side having one or more substrate LGA side contacts that are each positioned to be in contact with one of the LGA substrate side contacts and that are each connectable to a substrate chip side contact on the chip side that is connectable to a semiconductor chip, a separable and removable cooler including a fluid chamber, a spring clamp side, a chip side, and a chamber perimeter joined together to create a fluid chamber, and one or more fluid inlet openings through the spring clamp side, the fluid inlet openings permitting a cooling fluid to enter the fluid chamber and one or more fluid outlet openings through the spring clamp side, the fluid outlet openings permitting the cooling fluid to exit the fluid chamber, a load frame attached to the substrate and having an aperture in which the cooler is removably disposable, a spring clamp removably attachable to the load frame so that a spring force is applicable to the spring clamp side of the cooler and through the cooler toward the substrate and a removable load assembly device that applies a connection force between the loading frame and the LGA interposer to urge the loading frame and the LGA interposer together.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

In accordance with aspects of the invention, a first level package module structure is disclosed with direct attachment of a water cooling device to a chip where a land grid array (LGA) actuation load is applied around the perimeter of a substrate via an attached loading frame/stiffener. A spring clamp structure is provided to mechanically couple the cooler to the module loading frame/stiffener and to provide a compressive force to a thermal pad if used as a thermal interface material (TIM) layer. Further, the spring clamp structure mechanically decouples stresses from inlet/outlet fluid hoses and prevents an excessive tensile load from being applied to the TIM layer. The orientation of the removable cooler can be adjusted to accommodate chip height and tilt variations. The cooler is separable from the LGA module without the need to break any inlet or outlet fluid connections.

Figure 1:
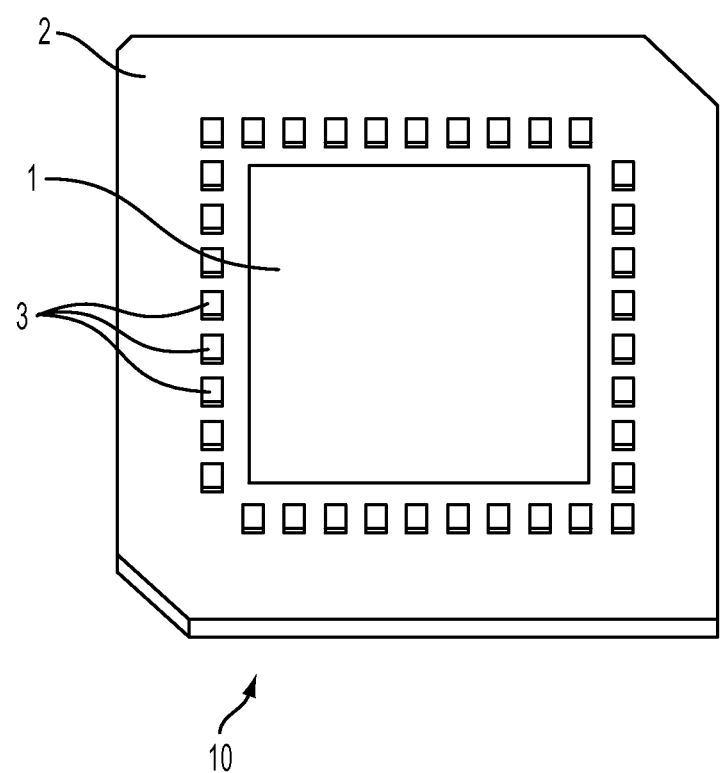
FIG. 1 is a perspective view of a chip and capacitors mounted on a substrate.

With reference to FIGS. 1-10 and, in accordance with embodiments, a method for assembling a separable and replaceable cooling module for cooling one or more semiconductor devices is provided. As shown in FIG. 1, a first operation includes attaching a chip 1 to a first level packaging substrate 2. The packaging substrate 2 may be a carrier fixture or some other similar member. The attaching may be completed by reflowing controlled collapse chip connectors (C4s), which may be fine pitch solder balls disposed on the chip 1 active surface, to connect the chip 1 to a matching set of pads on the packaging substrate 2 and then underfilling the chip 1 with a suitable polymer material to form a module subassembly 10. The packaging substrate 2 may be an organic laminate material or a ceramic material. Capacitors 3 or other electronic devices may also be attached to the packaging substrate 2 on the same side as the chip 1 or on the other side opposite the chip 1.

Figure 2:
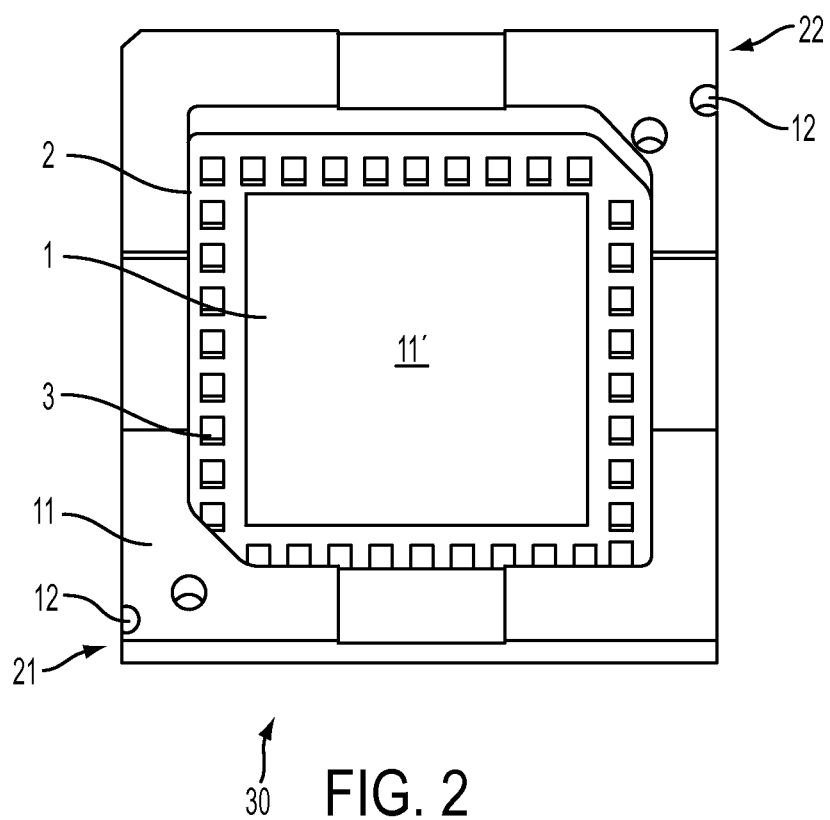
FIG. 2 is a perspective view of a loading frame attached to the substrate.

A next operation is to attach a load frame 11, which may include a stiffener member, to the packaging substrate 2 with an adhesive material or some other suitable fastener as shown in FIG. 2. In an alternate process flow, the load frame 11 may be attached to the packaging substrate 2 prior to the attachment of the chip 1 or the capacitors 3. The load frame 11 may be formed of a rigid material such as a metal or a metallic alloy and is formed to define an aperture 11'. For the case shown, the load frame 11 extends beyond an edge of the package substrate 2 at two opposite corners 21 and 22 and is formed to define substantially circular openings 12 for registration with alignment pins to be described below. When the load frame 11 is attached to the packaging substrate 2, a fixture or other alignment means is used to precisely locate the packaging substrate 2 relative to the load frame 11 during the adhesive cure so that the circular openings 12 for the alignment pins are disposed at a fixed location relative to LGA connection pads on the bottom surface of the packaging substrate 2. The combination of the chip 1, the packaging substrate 2, the load frame 11 (and optionally the capacitors 3) forms a completed first level package or module 30.

Figure 3:
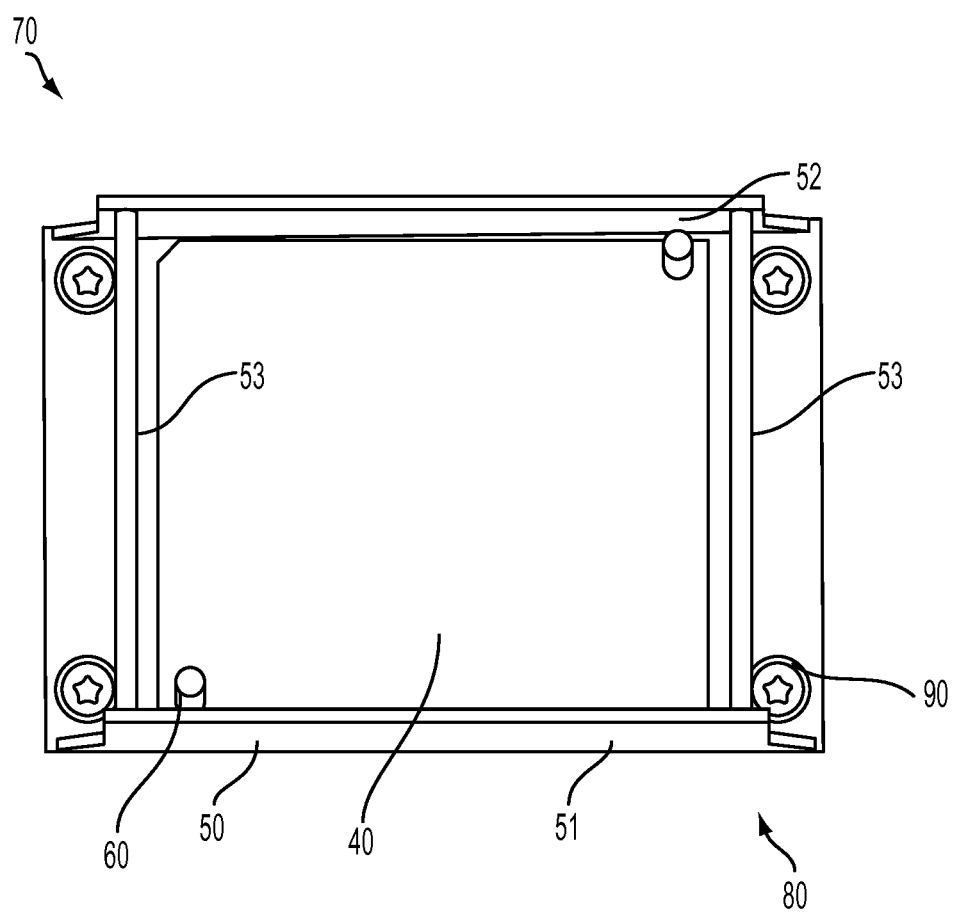
FIG. 3 is a perspective view of a land grid array (LGA) interposer, alignment pins and an LGA frame attached to a printed circuit board.

An LGA interposer 40, an LGA frame 50 and alignment pins 60 are illustrated in FIG. 3 as being mounted on a printed circuit board 70 to form an assembly 80. In accordance with embodiments, the LGA frame 50 includes first and second opposite sidewalls 51 and 52 and rods 53 that are suspended between and extend from sidewall 51 to sidewall 52. The rods 53 may be oriented substantially in parallel with one another. The alignment pins 60 may be attached to a backing plate 65, which is located on the opposite side of the printed circuit board 70 and is shown in the cross-sectional views of FIGS. 9 and 10. Fasteners 90, such as screws, may be used to attach the LGA frame 50 to the backing plate 65 (see FIG. 9). Openings are provided in the printed circuit board 70 for the alignment pins and the fasteners 90. The backing plate 65 serves to stiffen the printed circuit board 70 and may be used for applying a compressive load to the LGA interposer 40. An electrically insulating sheet (not shown) maybe located between the backing plate 65 and the printed circuit board 70.

Figure 4:
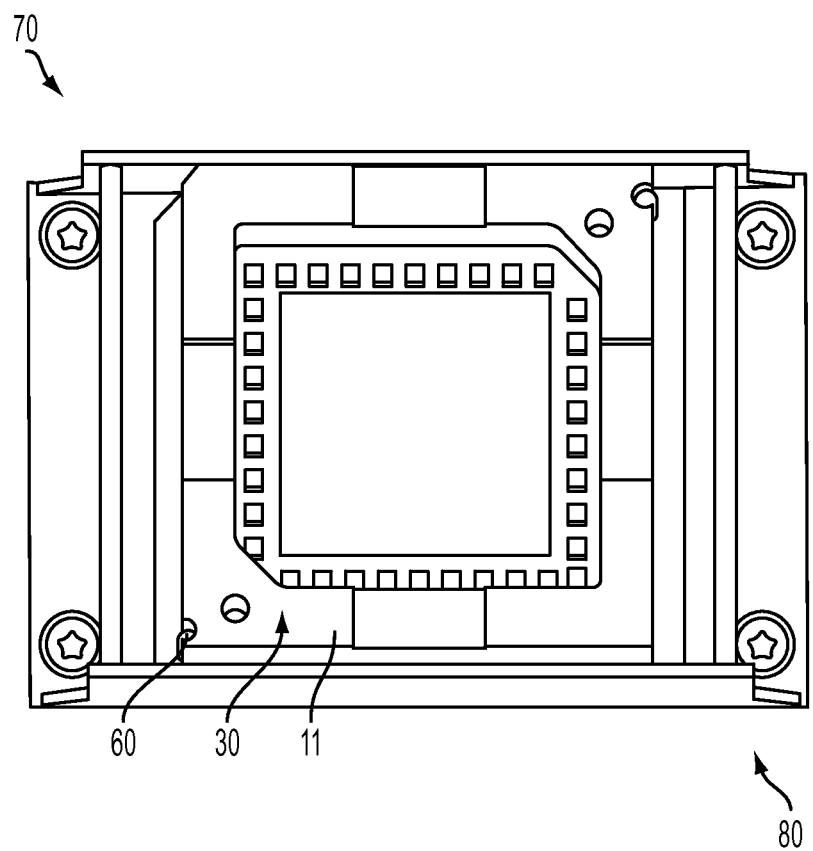
FIG. 4 is a perspective view of an assembly of FIG. 2 mounted in an assembly of FIG. 3.

As shown in FIG. 4, the module 30 formed as shown in FIG. 2 may then be assembled into the assembly 80 of FIG. 3. The alignment pins 60 serve to align the LGA connection pads on the bottom of the packaging substrate 2 of the module 30 with corresponding contacts on the LGA interposer 40.

Figure 5:
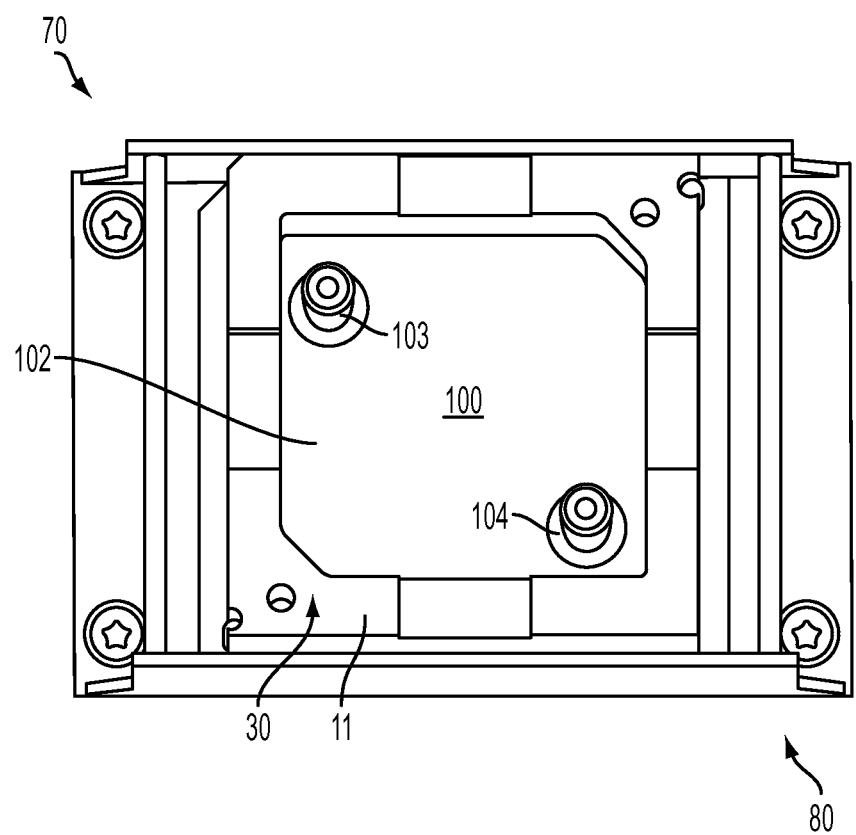
FIG. 5 is a perspective view of an assembly of FIG. 4 with a removable cooler.
Figure 9:
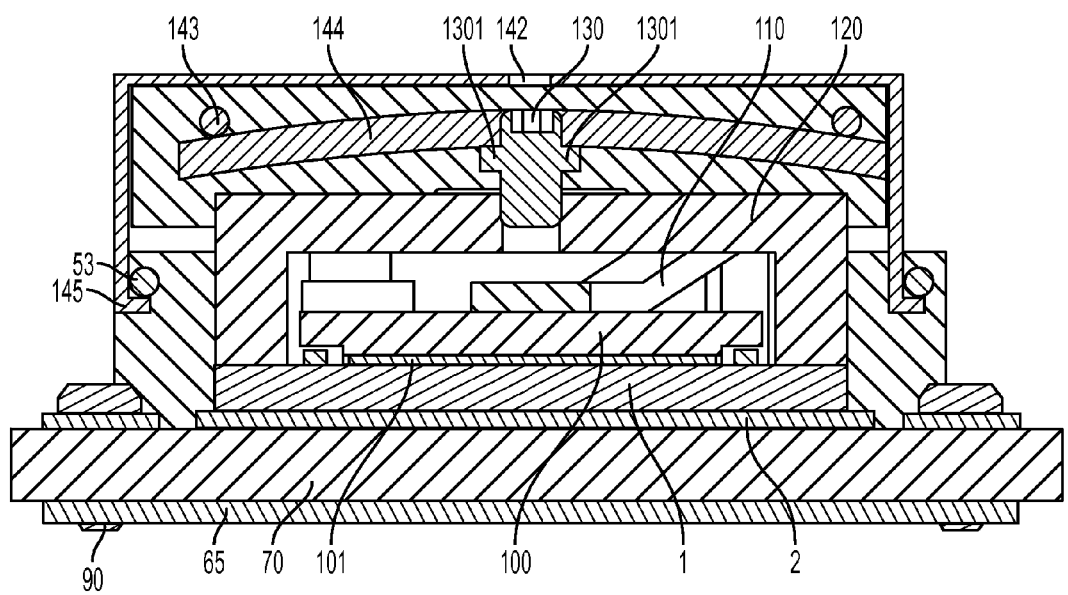
FIG. 9 is a cross-sectional view of an assembly of FIG. 8, which shows the tension screw and leaf springs in the load assembly and a backing plate to which the alignment pins are fastened.
Figure 10:
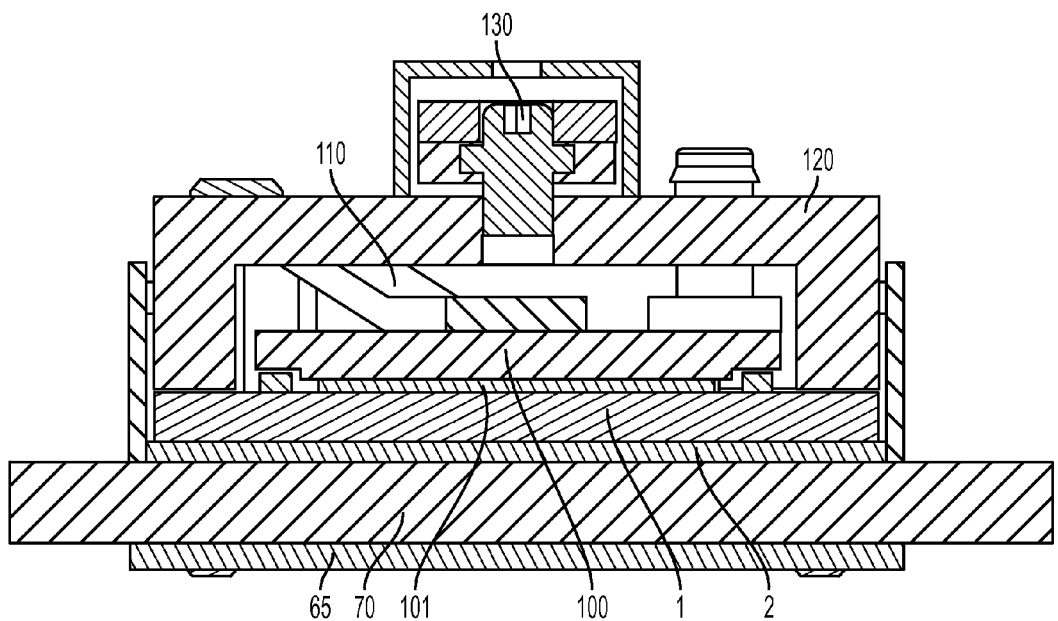
FIG. 10 is a cross-sectional view of an assembly of FIG. 8, which shows the tension screw and leaf springs in the load assembly and a backing plate to which the alignment pins are fastened.

In a next operation, as shown in FIGS. 5, 9 and 10, a removable cooler 100 is removably disposed on the backside of the chip 1 using a TIM layer 101 (see FIGS. 9 and 10) within the aperture 11' of the load frame 11. In accordance with embodiments, the removable cooler 100 may be formed from copper or other similar metallic materials or metallic alloys and includes an enclosed fluid chamber with flow passages 102 and having a chip side and a clamp side, one or more fluid inlet openings 103 in fluid communication with the flow passages and one or more fluid outlet openings 104 in fluid communication with the flow passages. A material of the TIM layer 101 may be a room temperature curing filled polymer, a phase change material, a compressible or incompressible thermal pad and/or some combination of these or other similar materials. Exemplary materials would include filled silicones, acrylics, epoxies, urethanes, hydrocarbon oils and waxes, metallic pads and graphite pads.

Figure 6:
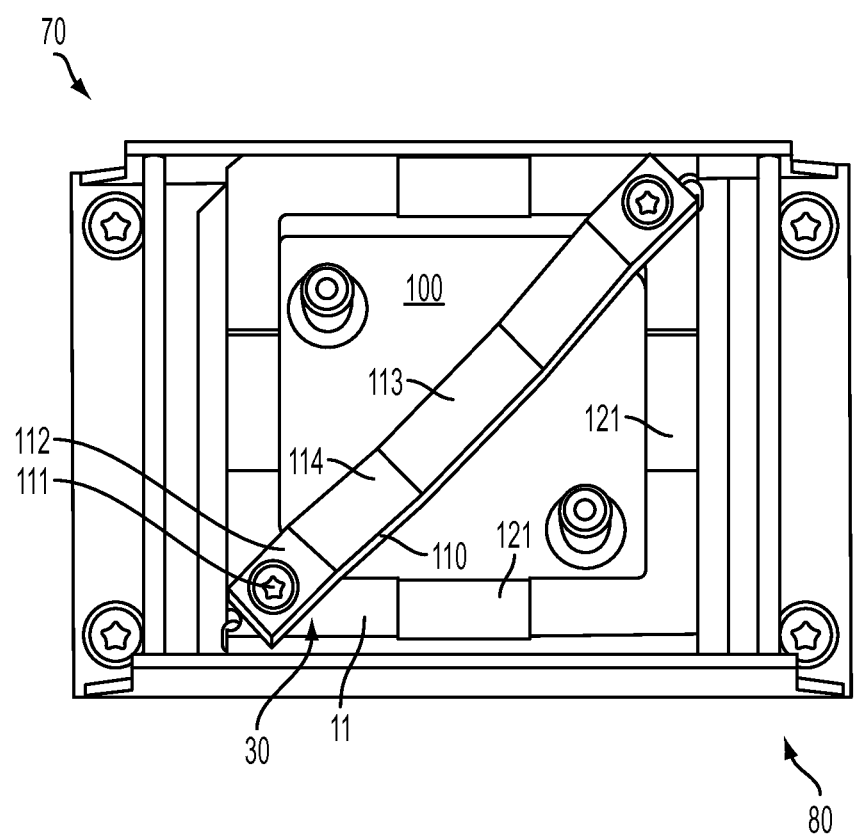
FIG. 6 is a perspective view of an assembly of FIG. 5 with a spring clamp.

As shown in FIG. 6, a spring clamp 110 is then attached to the load frame 11 using, for example, fasteners 111 such as screws that register with corresponding fastener portions of the load frame 11. The spring clamp 110 includes first and second planar portions 112 that register with surfaces of the load frame 11 at or around the fastener portions of the load frame, a central portion 113 that may contact with the removable cooler 100 and spring portions 114. The spring portions 114 connect the central portion 113 with the planar portions 112 and are disposed at an angle relative to the planar portions 112 and the central portion 113. When assembled with the load frame 11 and the removable cooler 100, the spring clamp 110 is designed such that when the central portion 113 is in contact with the removable cooler 100, the first and second planar portions 112 are somewhat above the surface of the load frame 11. As such, when fasteners 111 are secured, the planar portions 112 are forced into contact with the surface of the load frame 11 and the spring portions 114 are deflected so that a compressive load is provided to the removable cooler 100. The spring clamp 110 is thereby configured to provide a compressive load that is applicable down onto the clamp side of the removable cooler 100.

Alternate configurations of the spring clamp 110 are possible. For example, the spring portions 114 may have different shapes. But, in the no-load state with the central portion 113 in contact with the removable cooler 100, at least one of the first and second planar portions 112 will not be in contact with the surface of the load frame 11.

If a compressible thermal pad is used as the removable cooler 100, the compressive force provided by the spring clamp 110 should, in accordance with embodiments, exceed the force required to compress the thermal pad adequately to provide the desired thermal performance. The compressive force should also exceed any load which could potentially be applied by fluid hoses to the removable cooler 100 to prevent separating the thermal pad from the chip 1 or cooler surfaces. If a room temperature curing filled polymer for the TIM material is used, the compressive force provided by the spring clamp 110 should exceed any load which could potentially be applied by the fluid hoses to the removable cooler 100 which could tear the TIM material or separate the TIM material from the chip 1 or cooler surfaces. Note that the required compressive load of the spring clamp 110 will be lower with a curing filled polymer TIM material as it will tend to mechanically bond the chip 1 and cooler surfaces together.

Figure 7:
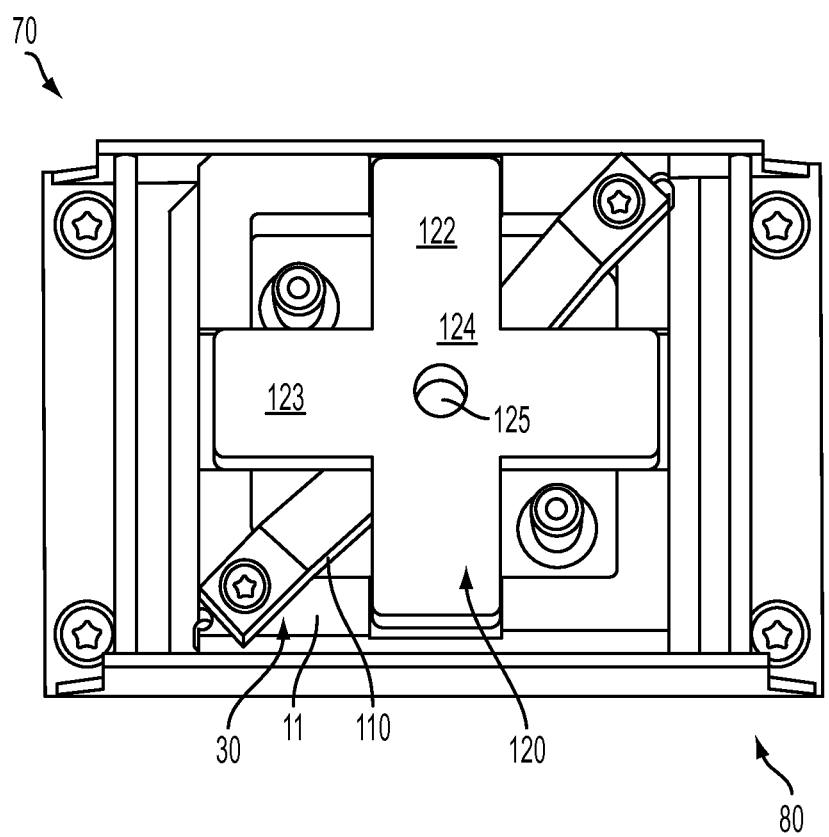
FIG. 7 is a perspective view of an assembly of FIG. 6 with an LGA load plate.

As shown in FIG. 7, in a next operation, an LGA load plate 120 is placed on the load frame 11 in the slots 121 (see FIG. 6) provided in sides of the load frame 11. The slots 121 are designed to properly locate the LGA load plate 120 on the load frame 11. The LGA load plate 120 is formed with a cross-shape having a first beam 122 extending across the load frame 11 in a first direction from a first slot 121 in a first side to a second slot 121 in a second side, a second beam 123 extending across the load frame 11 in a second direction from a third slot 121 in a third side to a fourth slot 121 in a fourth side and a center portion 124. The second direction may be defined as being transverse or, in some cases, perpendicular with respect to the first direction. The center portion 124 is defined where the first and second beams 122 and 123 meet and is formed to define a threaded hole 125.

The cross-shape of the LGA load plate 120 has certain advantages. These include the fact that when a force is applied to the LGA load plate 120, that force may be transmitted substantially evenly to first, second, third and fourth sides of the load frame 11. Also, the cross-shape of the LGA load plate 120 defines first, second, third and fourth quadrants whereby the fluid inlet openings 103 and the fluid outlet openings 104 occupy the first and third quadrants and the diagonal orientation of the spring clamp 110 permits portions of the spring clamp 110 to occupy the second and fourth quadrants.

When placed on the load frame 11 in the slots 121, the LGA load plate 120 is displaced from the spring portions 114 of the spring clamp 110. As long as the LGA load plate 120 remains in the slots 121, this displacement between the LGA load plate 120 and the spring portions 114 of the spring clamp 110 remains. In this way, direct loading of the spring clamp 110 and the removable cooler 100 is avoided.

The cross-shape of the LGA load plate 120 and the diagonal orientation of the spring clamp 110 are understood to be merely exemplary embodiments and that other configurations may be available. For example, the spring clamp 110 may have a cross-shape and the LGA load plate 120 may be formed as a single beam. In such a case, the first-fourth quadrants would be defined by the spring clamp 110 and the fluid inlet and outlet openings 103 and 104 would occupy quadrants not occupied by the LGA load plate 120.

Figure 8:
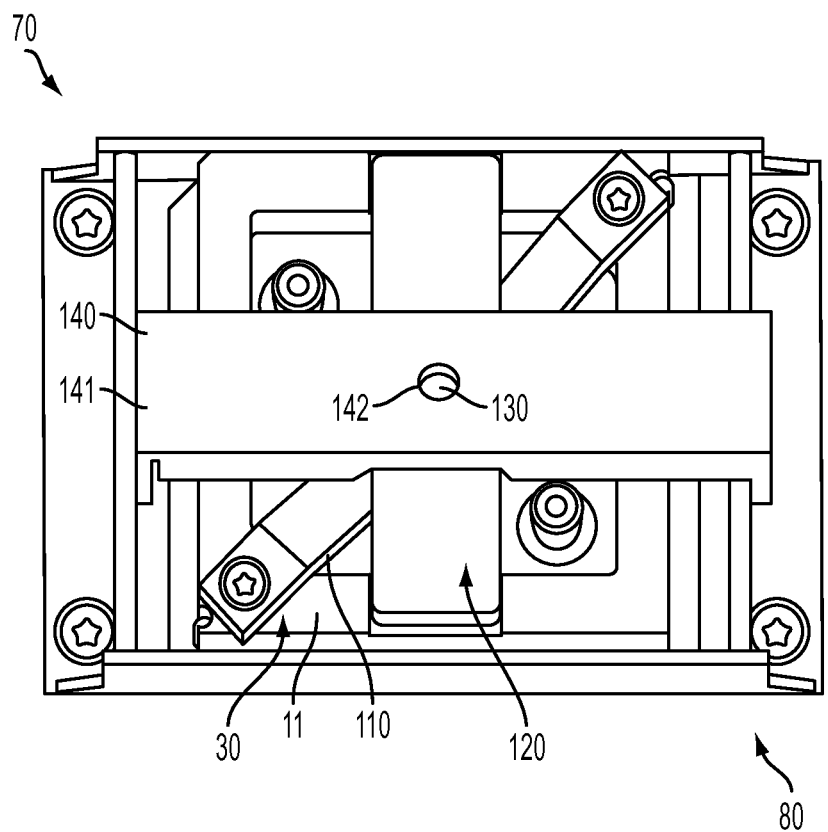
FIG. 8 is a perspective view of an assembly of FIG. 7 with a load assembly, which includes a tension screw and leaf springs.

As shown in FIGS. 8-10, a tension screw 130 is screwed into the threaded hole 125 of the LGA load plate 120. A load assembly 140 is then placed over at least one of the beams (i.e., first beam 123) of the LGA load plate 120. The load assembly 140 includes a body 141 that is formed to define an aperture 142, interior bars 143 and leaf springs 144 that are disposed within the body 141 and hooks 145. The load assembly 140 is hooked onto the rods 53 of the LGA frame 50 with the hooks 145 being laced around the rods 53 and thereby positioned such that the tension screw 130 is exposed via the aperture 142.

The tension screw 130 includes flanges 1301 that mechanically interfere with the leaf springs 144 and may be unscrewed from the LGA load plate 120 such that the flanges 1301 mechanically interfere with and deflect a center of the leaf springs 144 upwardly and against the bias applied to the leaf springs 144 by the interior bars 143. This can continue until the force from the leaf springs 144 applied to the tension screw 130 reaches a desired level at which the LGA interposer 40 is actuated to form electrical contacts between substrate 2 and the LGA interposer 40. Here, the LGA frame 50 is attached to the backing plate 65 such that the leaf springs 144 compress the LGA load plate 120 against the load frame 11 to thereby compress the packaging substrate 2, the LGA interposer 40 and the printed circuit board 70.

In the completed assembly, flexible fluid inlet and outlet hoses would be attachable to the fluid inlet openings 103 and the fluid outlet openings 104 of the removable cooler 100. To replace a module in the field, the tension screw 130 would be screwed into the LGA load plate 120 to remove tension from the leaf springs 144, the load assembly 140 would then be removed along with the tension screw 130 and the LGA load plate 120. At this point, the module 30, the removable cooler 100 and the spring clamp 110 could be removed from the LGA interposer 40 if adequate slack is provided in the fluid hoses. The spring clamp fasteners 111 could then be removed. If an adhesive TIM was used, torque could be applied between the removable cooler 100 and the module 30 to break the TIM bond and any remaining TIM residue removed from the bottom surface of the removable cooler 100. For curable silicone and acrylic elastomer TIMs, torque less than 80 in-lbs should be sufficient. For soft gel TIMs, torque of less than 20 in-lbs should be sufficient. New TIM material could be applied to the replacement module 30 and the removable cooler 100 reassembled to it using the spring clamp fasteners 111.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

The diagrams depicted herein are just one example. There may be many variations described therein without departing from the spirit of the invention. For instance, the operations associated with the diagrams may be performed in a differing order or operations may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A cooling module for cooling a semiconductor, comprising:
    a land grid array (LGA) interposer;
    a substrate with an LGA side for assembly on the LGA interposer and a chip side for attachment to the semiconductor;
    a cooler removably disposable on the semiconductor for cooling the semiconductor;
    a load frame attached to the substrate and formed to define an aperture, the cooler being removably disposable in the aperture;
    a spring clamp removably attachable to the load frame and configured to apply a spring force from the load frame to the cooler such that the substrate and the cooler are urged together sandwiching the semiconductor; and
    a load assembly device configured to apply a connection force to urge the load frame and the LGA interposer together to form electrical contact between the substrate and the LGA interposer.

2. The module according to claim 1, wherein the load assembly device comprises a cross-shaped load plate.

3. The module according to claim 2, wherein the cross-shaped load plate is displaced from the spring clamp.

4. The module according to claim 2, wherein the load assembly device further comprises: a tension screw; and a load assembly disposed over a portion of the cross-shaped load plate, wherein the cross-shaped load plate, the tension screw and the load assembly control the connection force between the substrate and the LGA interposer.

5. A cooling module for cooling one or more semiconductor devices, comprising:
    a land grid array (LGA) interposer;
    a substrate with an LGA side for assembly on the LGA interposer and a chip side to which the one or more semiconductor devices are attachable;
    a cooler including having a chip side for attachment to the one or more semiconductor devices, a clamp side, a fluid chamber for fluid cooling of the one or more semiconductor devices and fluid inlet and outlet openings in fluid communication with the fluid chamber;
    a load frame attached to the substrate and formed to define an aperture, the cooler being removably disposable in the aperture;
    a spring clamp removably attachable to the load frame and configured to apply a spring force from the load frame to the clamp side of the cooler such that the chip sides of the substrate and the cooler are urged toward one another; and
    a removable load assembly device that is configured to apply a connection force between the load frame and the LGA interposer to urge the load frame and the LGA interposer together to form electrical contact between the substrate and the LGA interposer.

6. The module according to claim 5, wherein the connection force is applied around a perimeter of the substrate.

7. The module according to claim 5, further comprising a plate attached to the LGA interposer with a printed circuit board interposed between the plate and the LGA interposer.

8. The module according to claim 5, further comprising thermal interface material (TIM) disposed between each of the one or more semiconductor devices and the chip side of the cooler such that the TIM forms a thermal connection between the one or more semiconductor devices and the cooler.

9. The module according to claim 8, wherein the spring force applied by the spring clamp is sufficient to prevent TIM separation.

10. The module according to claim 8, wherein the TIM has a separation force less than 30 pounds per square inch (psi) in shear.

11. The module according to claim 10, wherein the TIM has the separation force less than 15 psi in shear.

12. The module according to claim 8, wherein the TIM comprises one or more of a thermal pad, a thermal grease or a thermal gel.

13. The module according to claim 8, wherein the TIM has a separation torque less than 80 in-lbs.

14. The module according to claim 13, wherein the TIM has the separation torque less than 20 in-lbs.

15. The module according to claim 8, wherein the TIM comprises one or more of a cross linked thermal elastomer, a thermal pad, a thermal grease or a soft thermal gel.

16. The module according to claim 5, where the removable load assembly device comprises: an LGA load plate; and LGA loading hardware, wherein the LGA load plate and the LGA loading hardware control the connection force between the substrate and the LGA interposer.

17. A separable and replaceable cooling module for cooling one or more semiconductor devices, comprising:
- a land grid array (LGA) interposer having a board side with one or more board side contacts and a substrate side with one or more substrate side contacts that are each connected to a respective one of the one or more board side contacts;
- a substrate with an LGA side having one or more LGA side contacts that are each positioned to be in contact with a respective one of the substrate side contacts of the LGA interposer and a chip side having one or more chip side contacts that are each connectable to a semiconductor chip of the one or more semiconductor devices and the substrate side contacts of the LGA interposer;
- a separable and removable cooler including:
  - a fluid chamber, a spring clamp side, a chip side for removable disposition on the semiconductor chip, and a chamber perimeter joined together to create the fluid chamber,
  - one or more fluid inlet openings through the spring clamp side, the fluid inlet openings permitting a cooling fluid to enter the fluid chamber, and
  - one or more fluid outlet openings through the spring clamp side, the fluid outlet openings permitting the cooling fluid to exit the fluid chamber;
- a load frame attached to the chip side of the substrate and having an aperture in which the cooler is removably disposable;
- a spring clamp removably attachable to the load frame so that a spring force is applicable to the spring clamp side of the cooler and through the cooler toward the chip side of the substrate; and
- a removable load assembly device that applies a connection force between the loading frame and the LGA interposer to urge the loading frame and the LGA interposer together.

* * * * *